United States Patent
Miwa et al.

(10) Patent No.: US 6,247,937 B1
(45) Date of Patent: Jun. 19, 2001

(54) CIRCUIT BOARD INSERTABLE WITH MINIMIZED FORCE

(75) Inventors: Yohichi Miwa, Yamato; Masaru Terada, Shiga-ken; Tomoaki Kimura, Fujisawa, all of (JP)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/295,968

(22) Filed: Apr. 21, 1999

(30) Foreign Application Priority Data

Apr. 22, 1998 (JP) .................................................. 10-112304

(51) Int. Cl.[7] .................................................. H01R 12/00
(52) U.S. Cl. .......................................... 439/59; 439/924.1
(58) Field of Search ........................... 439/59, 74, 924.1, 439/924.2, 951, 637

(56) References Cited

U.S. PATENT DOCUMENTS

| | | | |
|---|---|---|---|
| 3,432,795 | * 3/1969 | Jayne | 439/60 |
| 4,331,370 | * 5/1982 | Andrews et al. | 439/75 |
| 5,224,019 | * 6/1993 | Wong et al. | 361/685 |
| 5,692,910 | * 12/1997 | Mittal | 439/59 |
| 5,709,555 | * 1/1998 | Noschese | 439/79 |

* cited by examiner

*Primary Examiner*—Tulsidas Patel
(74) *Attorney, Agent, or Firm*—Bernard D. Bogdon; Bracewell & Patterson, LLP; J. Bruce Schelkopf

(57) ABSTRACT

Provided is a system to reduce the force required for inserting a circuit board assembly including a plurality of circuit boards into the card edge connectors. A circuit board assembly includes a first circuit board, a second circuit board and a coupling part. The first circuit board includes printed circuit elements and a connecting part. In the same manner as the first circuit board, the second circuit board includes printed circuit elements and a connecting part. The front edge of the connecting parts are shifted from the front edge of the other connecting part by a distance "d" along the connecting or inserting direction of the circuit boards toward the card edge connectors, so that the distance between the front edge of the connecting part of the first circuit board and the first card edge connector differs from the distance between the front edge of the connecting part of the second circuit board and the second card edge connector.

2 Claims, 4 Drawing Sheets

CIRCUIT BOARD INSERTABLE WITH MINIMIZED FORCE

FIELD OF THE INVENTION

The present invention relates to a circuit board which can be inserted into a card edge connector by a force smaller than and minimized from that required for a circuit board of prior and similar structure.

BACKGROUND OF THE INVENTION

FIG. 1 shows a circuit board assembly and a card edge connector of a prior technology. The circuit board assembly 100 includes a first circuit board 120, a second circuit board 140 and a coupling part 160. The first circuit board 120 includes printed circuit elements 122 and a connecting part 124. Various circuit elements are mounted on the printed circuit elements 122. The connecting part 124 includes tabs 126 which electrically connect the circuit elements on the printed circuit elements 122 to a first card edge connector 200. The tabs 126 can be formed on one side or both sides of the connecting part 124. The tabs 126 are usually plated with gold, and hence the connecting part 124 is called as a gold tab card edge. In the same manner as the first circuit board 120, the second circuit board 140 includes printed circuit elements 142 and a connecting part 144, and the connecting part 144 includes tabs 146. The coupling part 160 supports the first circuit board 120 and the second circuit board 140 in parallel, and is composed of a screw, a sleeve and a nut in the example shown in the FIG. 1. The first circuit board 120 is electrically connected to the second circuit board 140. The first card edge connector 200 includes an elongated aperture 220, and terminals 240 are arranged within the aperture 220. The second card edge connector 300 includes an elongated aperture 320, and terminals 340 are arranged within the aperture 320.

FIG. 2 shows a cross section of the card edge connector and the circuit board when these are connected. In the FIG. 2(A), the connecting part 124 of the first circuit board 120 moves toward the elongated aperture 220 of the first card edge connector 200, and the leading portion of the connecting part 124 is pressed against the terminals 240. Each of the terminals 240 is formed by a leaf spring, and the terminals 240 are in a closed condition in the FIG. 2(A).

In the FIG. 2(B), when the connecting part 124 of the first circuit board 120 is inserted toward a bottom of the aperture 220 by an applied force, the terminals 240 are opened, the tabs 126 slide on the terminals 240, and the connecting part 124 is further inserted toward the bottom of the aperture 220. When the leading portion of the connecting part 124 engages with the bottom of the aperture 220 or the portions of the both sides edges of the first circuit board 120 engage with the card edge connector 200, the connecting part 124 is stopped, and in this stopped condition, the tabs 126 are electrically connected to the terminals 240. Although the connection of the first circuit board 120 is shown in the FIG. 2 for simplifying the description, the same connecting operation as the above operation is made for the second circuit board 140.

In general, the force F1 required for moving the connecting part 124 of the circuit board to open the terminals 240, as shown in the FIG. 2(A), is larger than the force F2 required for sliding the connector part 124 on the opened terminals 240, as shown in the FIG. 2(B). Accordingly, the maximum value of the force required for simultaneously inserting the two connecting parts of the two circuit boards with the same shape of the circuit board assembly into the card edge connector is represented 2 F1.

The following two methods have been used for connecting a plurality of circuit boards of the circuit board assembly 100 to the card edge connectors 200 and 300.

(1) After that the first circuit board 120 is connected to the card edge connector 200 and the second circuit board 140 is connected to the card edge connector 300, the first and second circuit boards 120 and 140 are electrically and mechanically connected. and (2) After that the first circuit board 120 and the second circuit board 140 are electrically and mechanically connected, both the circuit boards 120 and 140 are simultaneously connected to the card edge connectors 200 and 300, respectively.

Although a large force is not required to insert the respective circuit board into the card edge connector in the described method (1), it is necessary to electrically and mechanically connect both the circuit boards after the insertion of the respective circuit board into the card edge connector. This electrical and mechanical connection may prove to be difficult since the space between the circuit boards is narrow. Also, a more complicated mechanism is required to mechanically connect the circuit boards 120 and 140 in comparison with the described method (2), the method (1) is unfavorable in the size and the fabricating cost.

Although the assembling steps in the fabrication of the method (2) are relatively simple and the mechanism for mechanically coupling both the circuit boards is more simple than that of the method (1), the large force is required to simultaneously inserting the both the circuit boards into the card edge connectors. Therefore, the assembling work must be carefully made to prevent the problems that the large force causes the circuit boards to be distorted, so that solders are cracked, and the solders of the mounted circuit elements are peeled off.

SUMMARY OF THE INVENTION

It is therefor one object of the present invention to reduce the force required for inserting the circuit board assembly including a plurality of circuit boards into the card edge connectors.

It is yet another object of the present invention to provide the circuit board assembly which can be more easily inserted into the card edge connectors for realizing the easy assembling work and the simple connecting mechanism.

It is another object of the present invention to provide the circuit board assembly which does not damage or have a bad effect on the electrical and mechanical connections due to the insertion to the card edge connectors.

A circuit board in accordance with the present invention comprises a first connecting part and a second connecting part, and the first connecting part is shifted from the second connecting part in the connecting direction.

A circuit board in accordance with the present invention includes a first connecting part and a second connecting part, where a length of the second connecting part in the connecting direction is shorter than a length of the first connecting part in the connecting direction.

A circuit board in accordance with the present invention further includes a first connecting part and a second connecting part, and the first connecting part is shifted from the second connecting part in the connecting direction whereby the first connecting part and the second connecting part are not inserted into a connector at the same time.

A circuit board in accordance with the present invention includes a first connecting part and a second connecting part, and the first connecting part is shifted from the second connecting part in the connecting direction whereby a force required for inserting the first connecting part and the second connecting part into a connector is small.

A circuit board assembly in accordance with the present invention includes a first circuit board including a first connecting part, a second circuit board including a second connecting part and a coupling part for coupling the first circuit board and the second circuit board, and the first connecting part is shifted from the second connecting part in the connecting direction.

A circuit board connecting system in accordance with the present invention includes a circuit board including a first connecting part and a second connecting part, and a card edge connector for connecting to the first connecting part and the second connecting part, and the first connecting part is shifted from the second connecting part in the connecting direction whereby the first connecting part and the second connecting part are not inserted into the card edge connector at the same time.

A method for inserting a circuit board including a first connecting part and a second connecting part into connectors, in accordance with the present invention includes the steps of inserting the first connecting part into a first connector, and inserting the second connecting part into a second connector during further insertion of the first connecting part into the first connector.

DETAILED DESCRIPTION OF THE PREFERRED EMBODIMENT

Figure 1:
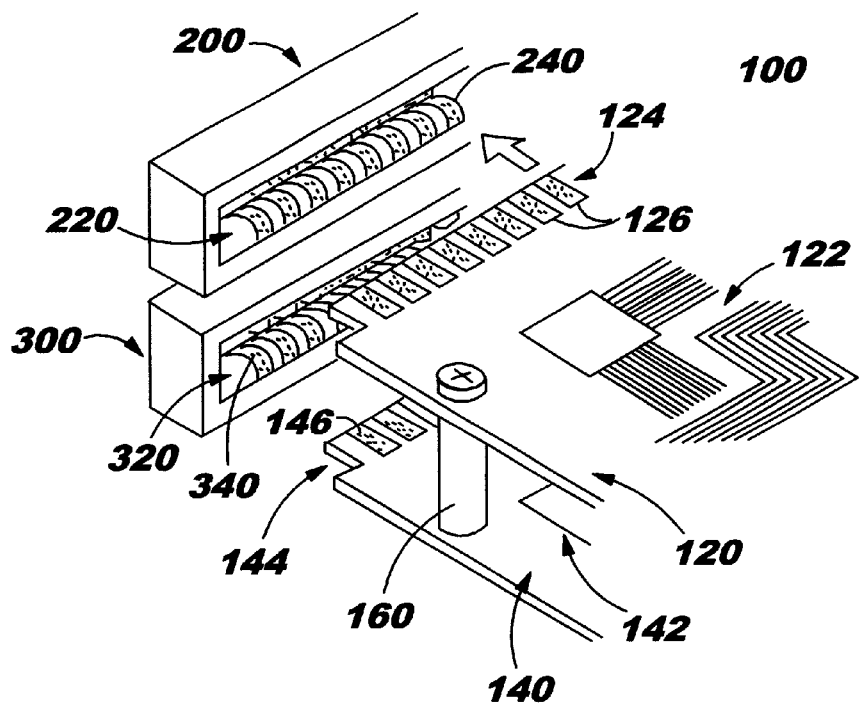
FIG. 1 shows the circuit board assembly and the card edge connectors of the prior technology.
Figure 2A:
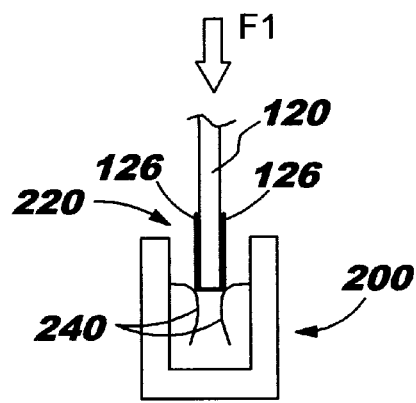
FIG. 2 shows a cross section of the card edge connector and the circuit board of the prior technology when these are connected.
Figure 2B:
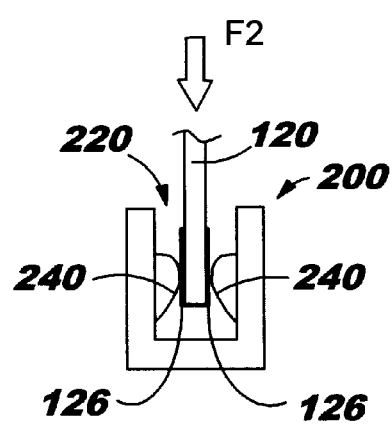

The following provides a brief description of symbols regarding the elements of the figures. Provided is a circuit board assembly 100; a first circuit board 120; printed circuit elements 122; connecting part 124; tab 126; a second circuit board 140; printed circuit elements 142; connecting part 144; tab 146; coupling part 160; first card edge connector 200; aperture 220; terminal 240; second card edge connector 300; aperture 320; and terminal 340.

Figure 3:
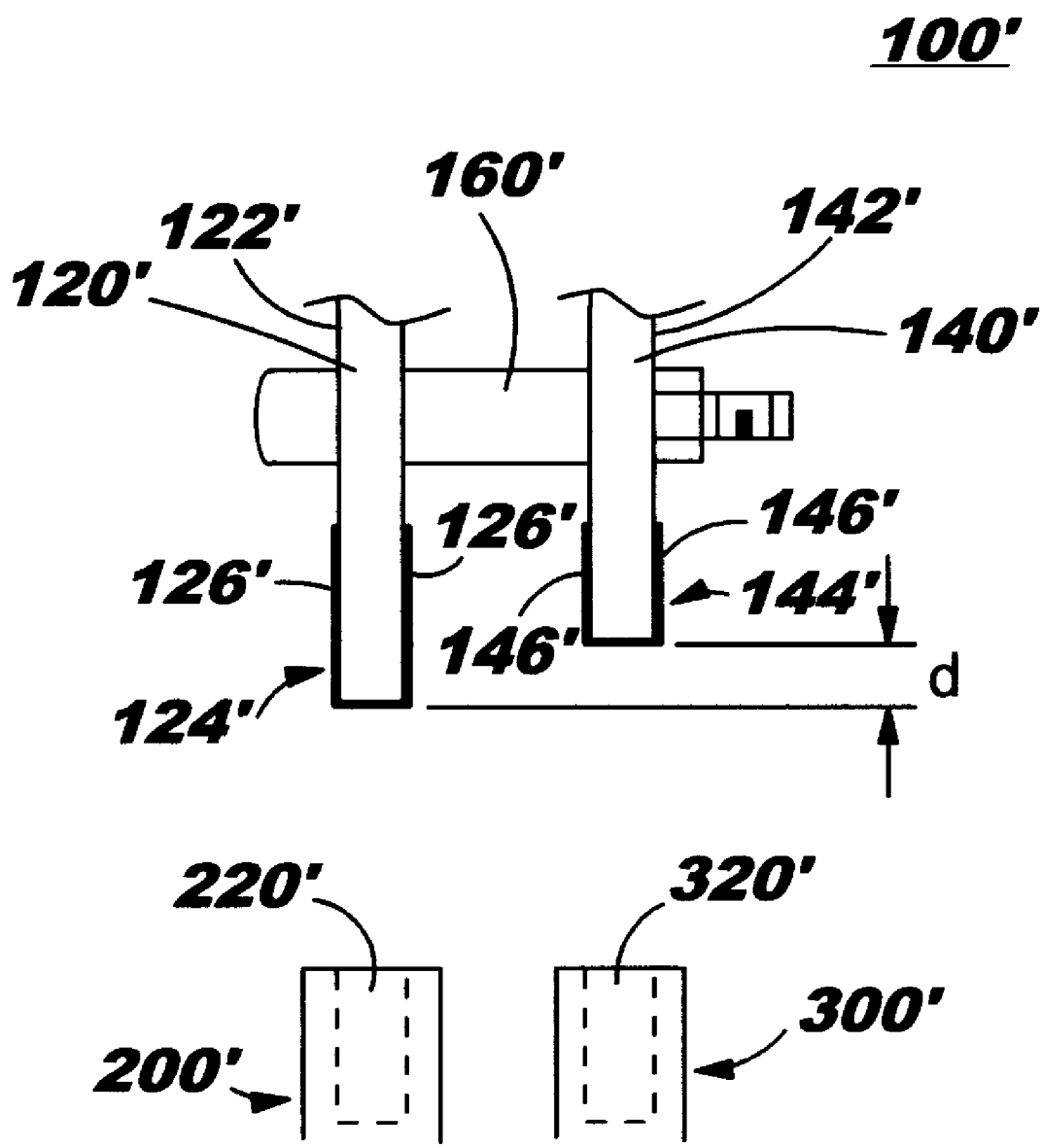
FIG. 3 shows one embodiment of the circuit board assembly of the present invention.

FIG. 3 shows one embodiment of the circuit board assembly of the present invention. The circuit board assembly 100' includes a first circuit board 120', a second circuit board 140' and a coupling part 160'. The first circuit board 120' includes printed circuit elements 122' and a connecting part 124'. Various circuit elements, not shown, are mounted on the printed circuit elements 122'. The connecting part 124' includes tabs 126' which electrically connect the circuit elements on the printed circuit elements 122' to a first card edge connector 200'. In the same manner as the first circuit board 120', the second circuit board 140' includes printed circuit elements 142' and a connecting part 144', and the connecting part 144' includes tabs 146'. The coupling part 160' supports the first circuit board 120' and the second circuit board 140' in parallel, and is constituted by a screw, a sleeve and a nut in the example shown in the FIG. 3. The first circuit board 120' is electrically connected to the second circuit board 140'. The first card edge connector 200' includes an elongated aperture 220' and terminals 240' are arranged within the aperture 220'. The second card edge connector 300' includes an elongated aperture 320', and terminals 340' are arranged within the aperture 320'.

In the case of a personal computer (PC), for example, the connecting part 124' is connected to an ISA bus through the first card edge connector 200', and the connecting part 144' is connected to a PCI bus through the second card edge connector 300'.

The first circuit board 120' is shifted from the second circuit board 140' by a distance "d" along the connecting or inserting direction of the circuit boards 120' and 140' toward the card edge connectors 200' and 300', so that the distance between the front edge of the connecting part 124' of the first circuit board 120' and the first card edge connector 200' differs from the distance between the front edge of the connecting part 144' of the second circuit board 140' and the second card edge connector 300'. The length of one of the connecting parts along the inserting direction of the card edge connectors can be shortened than the length of the other of the connecting parts so that the length of the connecting part 124' differs from the length of the connecting part 144' by the distance "d" along the inserting direction.

Figure 4A:
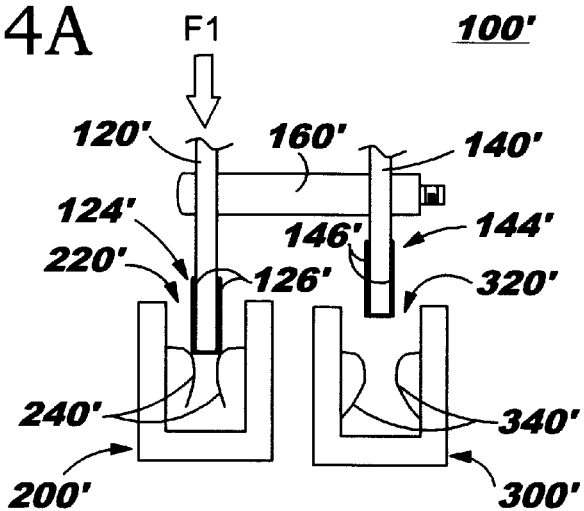
FIG. 4 shows cross sections of the circuit boards and the card edge connectors when the circuit board assembly is connected to the card edge connectors.

FIG. 4 shows cross sections of the circuit boards 120' and 140' and the card edge connectors 200' and 300' when the circuit board assembly 100' is connected to the card edge connectors 200' and 300'. In the FIG. 4(A), the first circuit board 120' and the second circuit board 140' are moved in the inserting direction, and only the front edge of the connecting part 124' of the first circuit board 120' is pressed against the terminals 240' within the aperture 220' of the first card edge connector 200'. Each of the terminals 240' is made of the leaf spring, and the terminals 240' are in the closed condition in the FIG. 4(A). At this point in the insertion process, the front edge of the connecting part 144' of the second circuit board 140' is separated from the front edges of the terminals 340'.

Figure 4B:
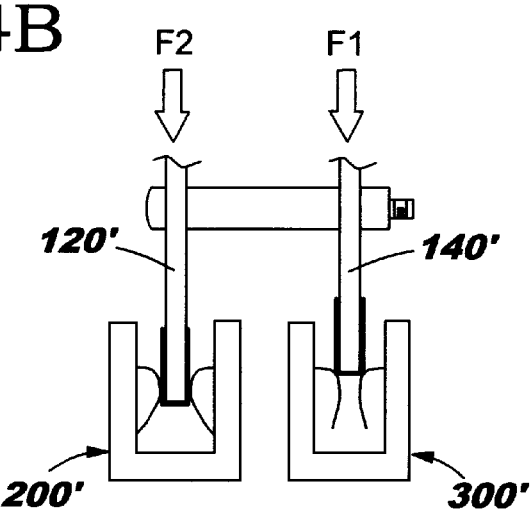

In the FIG. 4(B), when the connecting part 124' of the first circuit board 120' is applied with the force toward the bottom of the aperture 220', the terminals 240' are opened, and each of the tabs 126' of the connecting part 124' slides on each of the terminals 240' and the connecting part 124' is further moved toward the bottom of the aperture 220'. During this movement, the connecting part 144' of the second circuit board 140' is also moved toward the aperture 320' of the second card edge connector 300', and the front edge of the connecting part 144' is pressed against the terminals 340'. Each of the terminals 340' is made of the leaf spring, and the terminals 340' are in the closed condition in the FIG. 4(B).

Figure 4C:
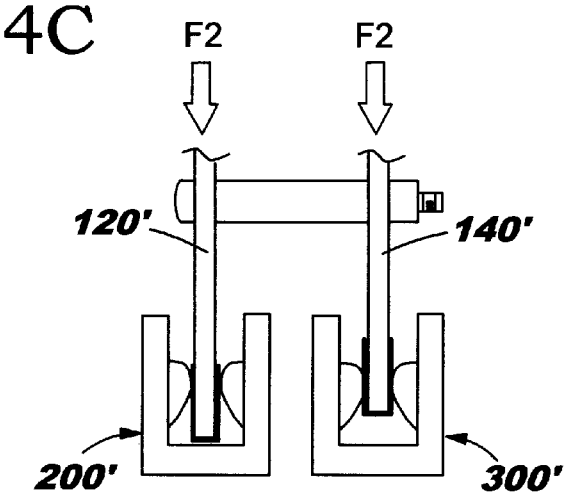

In the FIG. 4(C), the connecting part 124' is stopped when the connecting part 124' engages with the bottom of the aperture 220' or the portions of the both sides edges of the first circuit board 120' engage with the card edge connector 200'. In this condition, each of the tabs 126' is electrically connected to each of the terminals 240'. The following describes the movement of the second circuit board 140 which is moved until there is a stop of the connecting part 124' of the first circuit board 120', before which the connecting part 144' of the second circuit board 140' is moved toward the bottom of the aperture 320', so that the terminals 340' are initially opened, and each of the tabs 146' slides on each of the terminals 340', and the connecting part 144' is moved toward the bottom of the aperture 320'. The movement of the connecting part 144' is stopped at the stop of the connecting part 124' of the first circuit board 120'. In this condition, each of the tabs 146' is electrically connected to each of the terminals 340'.

With reference to the FIG. 4, the strength of force required for inserting the circuit boards into the card edge connectors is discussed. It is assumed, for purposes of this discussion, that the shape of the first circuit board 120' is the same as that of the second circuit board 140' and the shape of the card edge connector 200' is the same as that of the card edge connector 300', for simplifying the description.

The force required for connecting the circuit board assembly 100' to the card edge connectors 200' and 300' in the FIG. 4(A) is equal to the force F1 required for inserting the connecting part 124' of the first circuit board 120' into the first card edge connector 200'.

The force required for connecting the circuit board assembly 100' to the card edge connectors 200' and 300' in the FIG. 4(B) is equal to the sum of the force F2 required for sliding the connecting part 124' of the first circuit board 120' on the terminals 240', and the force F1 required for inserting the connecting part 144' of the second circuit board 140' into the second card edge connector 300'. That is, the force F1+F2 is required in the FIG. 4(B).

The force required for connecting the circuit board assembly 100' to the card edge connectors 200' and 300' in the FIG. 4(C) is equal to 2 F2.

Accordingly, the force required for connecting the circuit board assembly 100' to the card edge connectors 200' and 300' becomes the largest value F1+F2 in the FIG. 4(B).

The force F1+F2 is smaller than the force 2 F1 required for simultaneously inserting both the two circuit boards of the prior circuit board assembly into the card edge connectors.

It has been confirmed by an experiment performed by the inventors of the present invention using a typical circuit board assembly combined with the ISA bus card and the PCI bus card that the required insertion force by the present invention is 10 Kgf, while the required insertion force by the prior technology is 18 Kgf, so that, in comparison, the decrease of about 44% is realized.

If the distance "d" of the shift of one circuit board in the insertion direction toward the card edge connector is too large, the electrical connection becomes unstable, and if the distance "d" is too small, the effect for decreasing the insertion force is not expected. In the above experiment, it has been found that the preferable range of the distance "d" is 0.5 mm to 3 mm, and more preferable value of the distance "d" is 1 mm. It is noted, however that this value can be varied, depending upon the shape and the structure of the connectors and the connecting parts.

Although the circuit board assembly including the two circuit boards is described in the embodiment for simplifying the description, the same effects as performed in the above circuit board assembly is expected in the circuit assembly including more than two circuit boards by gradually shifting the front edge of the respective connecting part each other.

Figure 5:
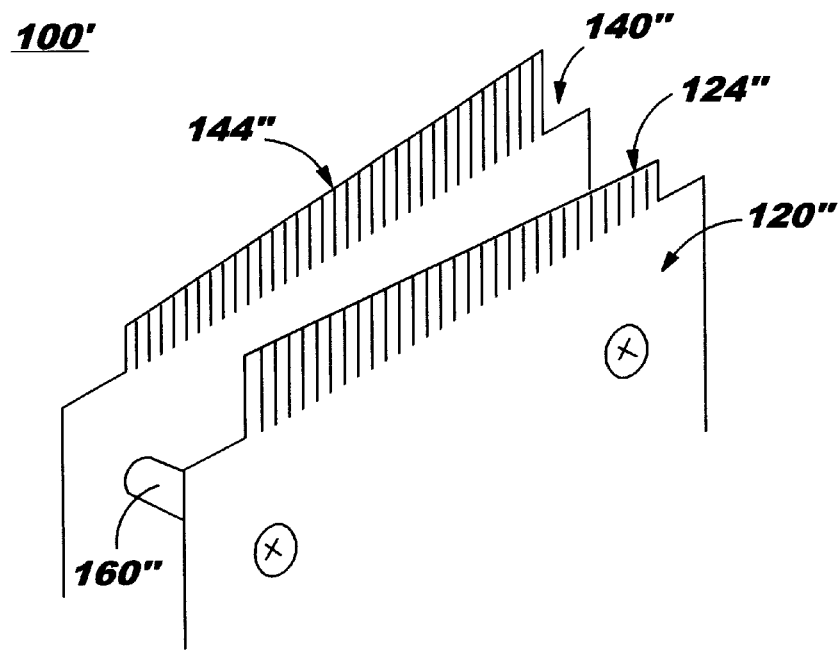
FIG. 5 shows another embodiment of the circuit board assembly of the present invention.

FIG. 5 shows another embodiment of the circuit board assembly of the present invention. The circuit board assembly 100" includes a first circuit board 120", a second circuit board 140" and a coupling part 160". The first circuit board 120" includes a connecting part 124". The front edge of the connecting part 124" is so formed that the length of the connecting part 124" along the inserting direction is gradually shortened from the left side to the right side viewing in the FIG. 5. The second circuit board 140" includes a connecting part 144". The front edge of the connecting part 144" is so formed that the length of the connecting part 144" along the inserting direction is gradually shortened from the right side to the left side viewing in the FIG. 5.

Figure 6:
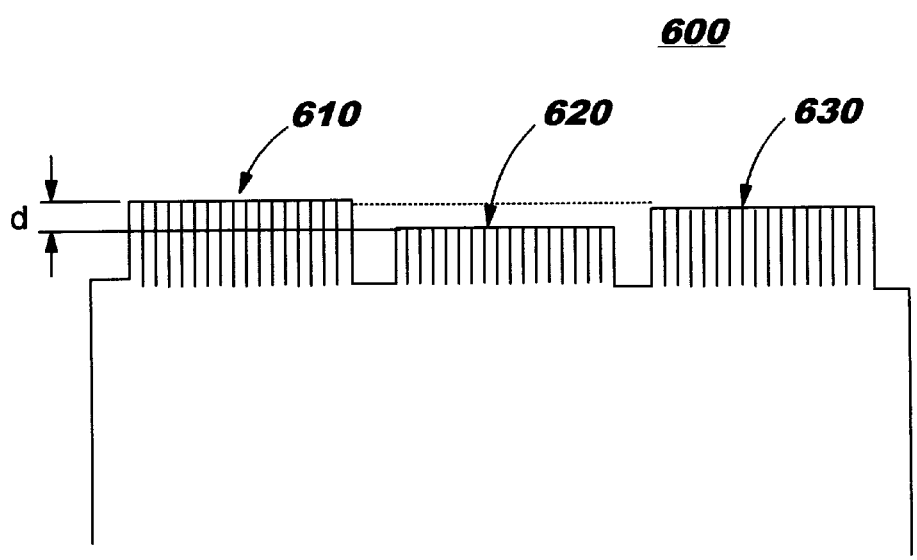
FIG. 6 shows further another embodiment of the circuit board assembly of the present invention.

FIG. 6 shows further another embodiment of the circuit board assembly of the present invention. It is noted that a single circuit board 600 is used in this embodiment. The circuit board 600 includes a first connecting part 610, a second connecting part 620 and a third connecting part 630. The length of the second connecting part 620 along the inserting direction is shorter than the length of the first and third connecting parts 610 and 630 along the inserting direction by the distance "d". The reason for using the first and third connecting parts of the same length is to stabilize the insertion to the card edge connector. This embodiment is suitable for a memory card of the PC.

Another structure can be used to implement the present invention. For example, a front edge of one of the card edge connectors, which faces to the connecting part of the circuit board, can be shifted in the inserting direction with respect to the front edge of the other card edge connector. The terminals of one card edge connector can be shifted in the inserting direction with respect to the terminals of the other card edge connector. In place of the combination of the tab and the terminal, a combination of a pin and a hole, which is called as a pin connector, can be used.

Therefore meritorious effects of the present invention are realized and in accordance with the present invention, it is possible to reduce the force required for inserting the circuit board assembly including a plurality of circuit boards into the card edge connectors. It is further possible to provide the circuit board assembly which can be easily inserted into the card edge connectors for realizing the easy assembling work and the simple connecting mechanism. Additionally, it is possible to provide the circuit board assembly which does not have a bad effect on the electrical and mechanical connections due to the insertion to the card edge connectors.

What is claimed is:

1. An electrical assembly, comprising:
   a connector assembly having first and second card edge connectors that are spaced apart from each other;
   a circuit board assembly having first and second circuit boards with electrical first and second connecting parts, respectively, extending therefrom, the circuit boards being coupled to each other and having planes that are spaced apart from each other such that the connecting parts align with respective ones of the card edge connectors; and wherein
   a leading edge of the first connecting part is offset from and extends beyond a leading edge of the second connecting part in a direction parallel to the planes of the circuit boards, such that when one of the connector assembly and the circuit board assembly is moved toward the other for electrical interconnection, the leading edge of the first connecting part engages the first card edge connector before the leading edge of the second connecting part engages the second card edge connector.

2. An electrical assembly, comprising:
   a connector assembly having first and second card edge connectors that are spaced apart from each other;

a circuit board assembly having first and second circuit boards with electrical first and second connecting parts, respectively, extending therefrom, the circuit boards being coupled to each other and having planes that are spaced apart from each other such that the connecting parts align with respective ones of the card edge connectors; and wherein a leading edge of the first connecting part is skewed relative to a leading edge of the second connecting part in a direction parallel to the planes of the circuit boards, such that when one of the connector assembly and the circuit board assembly is moved toward the other for electrical interconnection, one end of the leading edge of the first connecting part engages the first card edge connector at the same time that an opposite end of the leading edge of the second connecting part engages the second card edge connector.

* * * * *